US011335696B2

(12) United States Patent
Otaguro et al.

(10) Patent No.: US 11,335,696 B2
(45) Date of Patent: May 17, 2022

(54) SEMICONDUCTOR MEMORY DEVICE

(71) Applicant: Kioxia Corporation, Minato-ku (JP)

(72) Inventors: Kenya Otaguro, Mie (JP); Hisashi Nishimura, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 64 days.

(21) Appl. No.: 16/775,325

(22) Filed: Jan. 29, 2020

(65) Prior Publication Data

US 2021/0066338 A1 Mar. 4, 2021

(30) Foreign Application Priority Data

Aug. 28, 2019 (JP) .............................. JP2019-155814

(51) Int. Cl.
*H01L 27/115* (2017.01)
*H01L 27/11582* (2017.01)
*H01L 23/532* (2006.01)
*H01L 27/1157* (2017.01)

(52) U.S. Cl.
CPC .. *H01L 27/11582* (2013.01); *H01L 23/53257* (2013.01); *H01L 27/1157* (2013.01)

(58) Field of Classification Search
CPC ..... H01L 27/11582; H01L 2924/00014; H01L 27/11556; H01L 27/11565; H01L 27/1157; H01L 29/7926; H01L 29/66666
See application file for complete search history.

(56) References Cited

U.S. PATENT DOCUMENTS

| 10,304,851 B2 * | 5/2019 | Nakaki ............. H01L 27/11575 |
| 2019/0074287 A1 | 3/2019 | Yagi et al. |
| 2019/0088672 A1 | 3/2019 | Tomimatsu |
| 2019/0269221 A1 | 9/2019 | Jung et al. |

FOREIGN PATENT DOCUMENTS

JP 2019-50243 A 3/2019

* cited by examiner

*Primary Examiner* — Tony Tran
(74) *Attorney, Agent, or Firm* — Oblon, McClelland, Maier & Neustadt, L.L.P.

(57) ABSTRACT

A semiconductor memory device according to an embodiment includes a substrate, a first conductive layer, first and second pillars. The substrate includes first to third regions. The first pillars are provided in the first region to penetrate the first conductive layer. The second pillars are provided in the second region or the third region to penetrate the first conductive layer. The second region includes first and second sub-regions. The first sub-region includes a contact corresponding to the first conductive layer. A coverage of the second pillars in the second sub-region is higher than a coverage of the second pillars in the first sub-region and lower than or equal to a coverage of the first pillars in the first region.

20 Claims, 14 Drawing Sheets

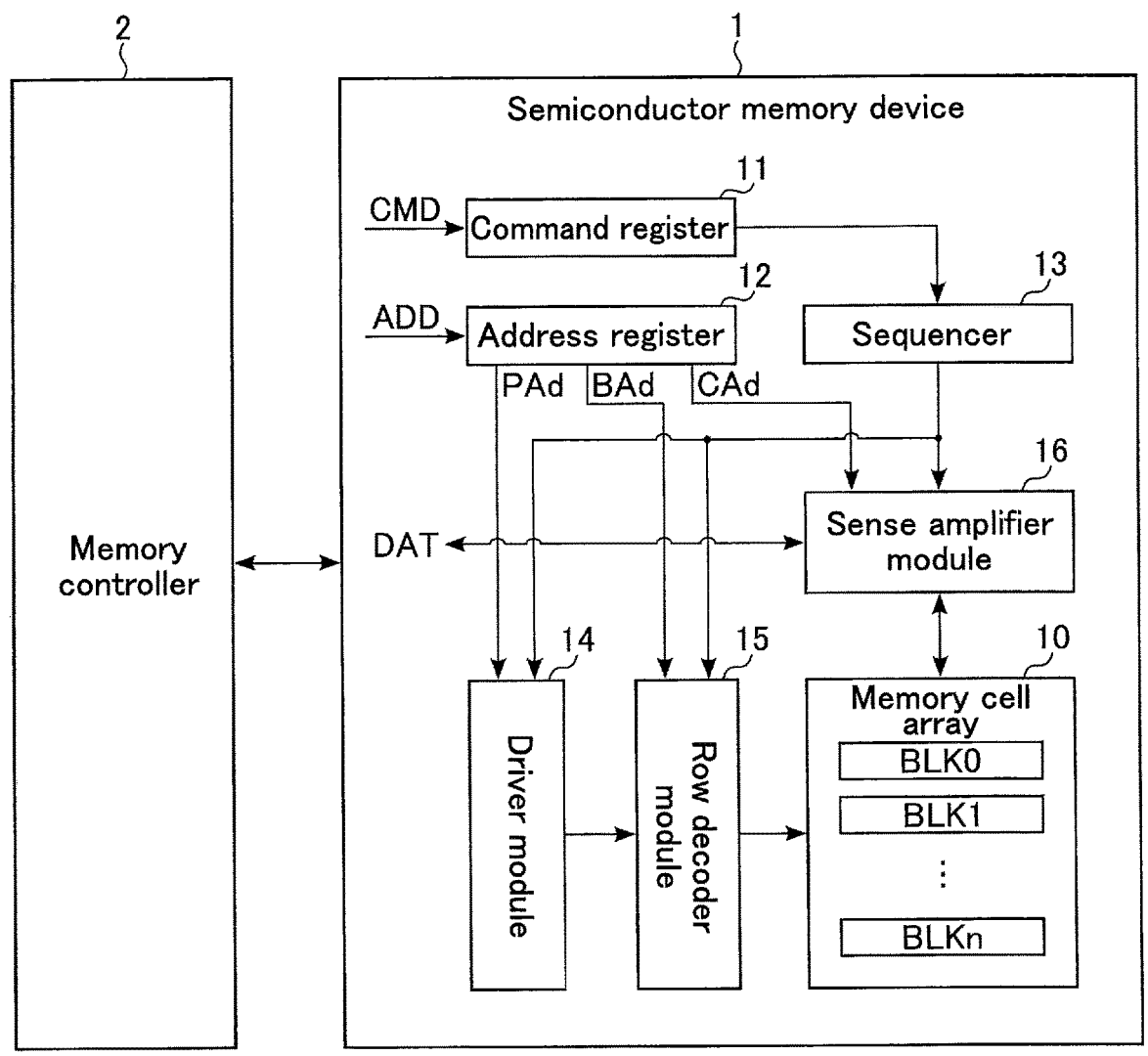
F I G. 1

(1) Stacking of sacrificial members
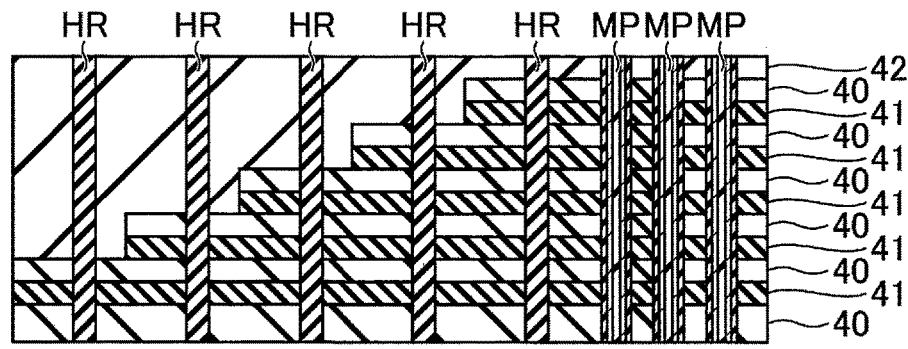
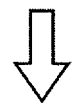
(2) Removal of sacrificial members
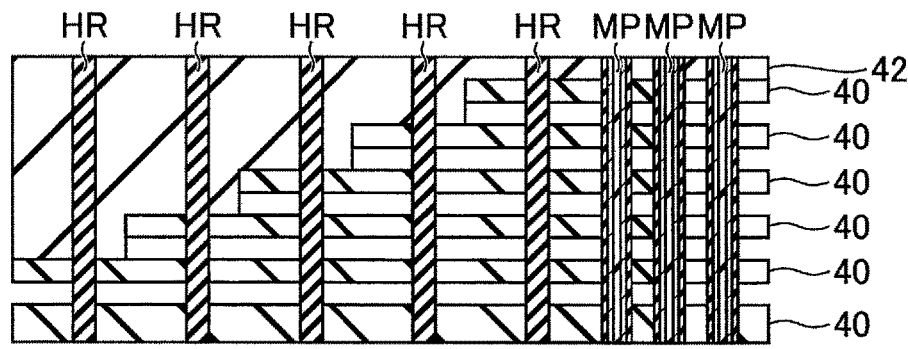
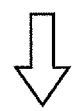
(3) Formation of conductors
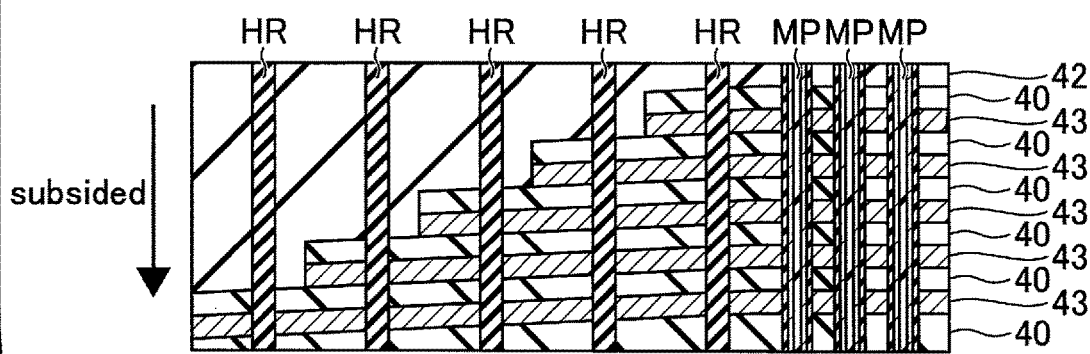
F I G. 11

SEMICONDUCTOR MEMORY DEVICE

CROSS-REFERENCE TO RELATED APPLICATIONS

This application is based upon and claims the benefit of priority from Japanese Patent Application No. 2019-155814, filed Aug. 28, 2019, the entire contents of which are incorporated herein by reference.

FIELD

Embodiments described herein relate generally to a semiconductor memory device.

BACKGROUND

There is known a NAND-type flash memory that is capable of storing data in a nonvolatile manner.

BRIEF DESCRIPTION OF THE DRAWINGS

FIG. 1 is a block diagram showing a semiconductor memory device according to an embodiment.

FIG. 11 is a cross-sectional view showing an exemplary method of forming a stacked wiring structure of a semiconductor memory device.

DETAILED DESCRIPTION

Figure 2:
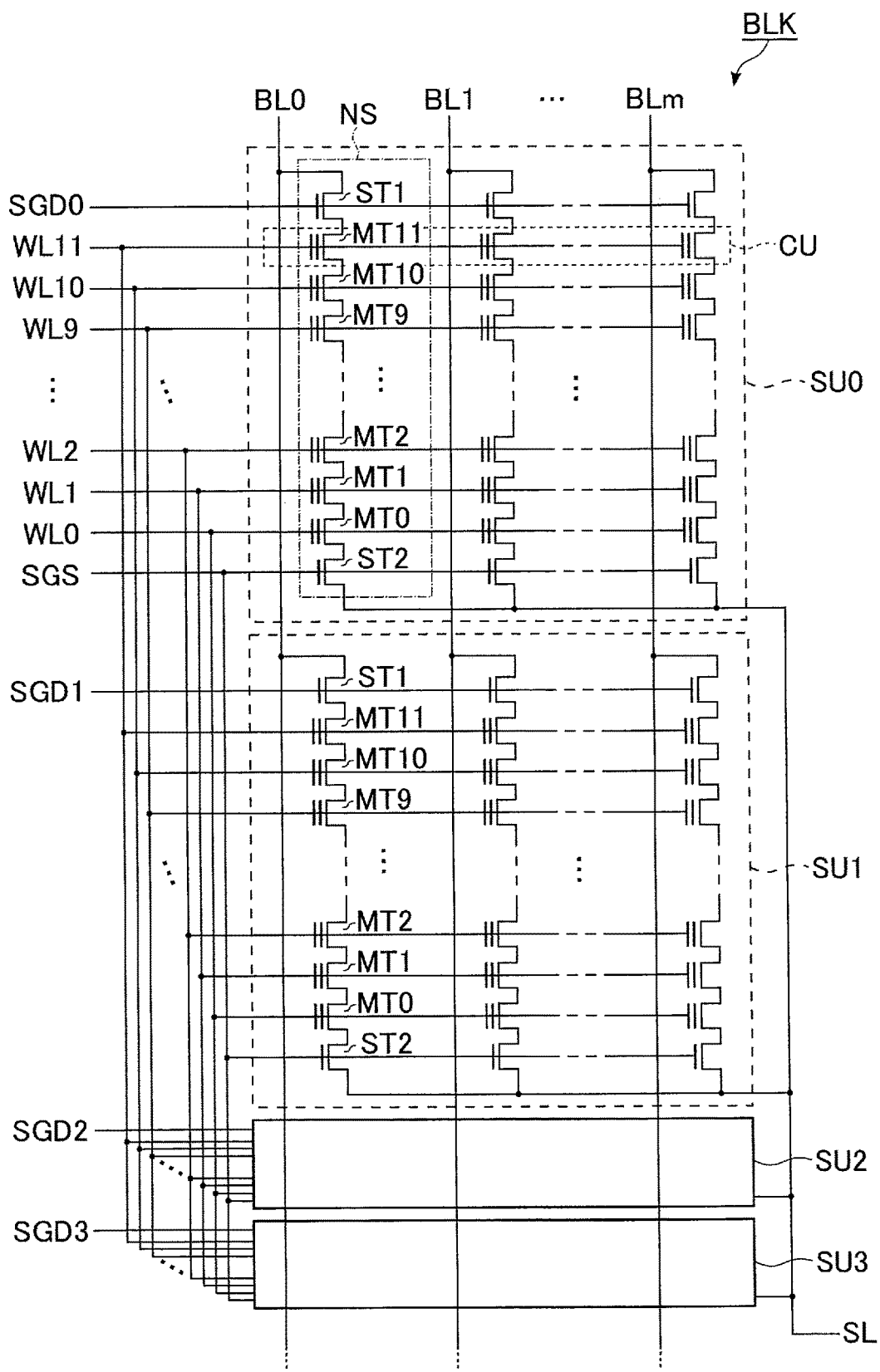
FIG. 2 is a circuit diagram of a memory cell array in the semiconductor memory device according to the embodiment.

In general, according to one embodiment, a semiconductor memory device includes a substrate, first to third insulating members, a first conductor, a second conductor, a plurality of first pillars, a plurality of second pillars, a plurality of third pillars, and a plurality of fourth pillars. The substrate includes a first region, a second region and a third region. The first region includes memory cells and is interposed between the second region and the third region along a first direction. The first to third insulating members are arranged in a second direction intersecting the first direction. Each of the first to third insulating members is provided across the first to third regions along the first direction. The first conductor is provided above the substrate and between the first insulating member and the second insulating member. The second conductor is provided above the substrate and between the second insulating member and the third insulating member. The first pillars are provided in the first region to penetrate the first conductor. The second pillars are provided in the second region or the third region to penetrate the first conductor. The second pillars are separated from a first contact corresponding to the first conductor. The third pillars are provided in the first region to penetrate the second conductor. The fourth pillars are provided in the second region or the third region to penetrate the second conductor. The fourth pillars are separated from a second contact corresponding to the second conductor. A coverage of the second pillars in the third region is higher than a coverage of the second pillars in the second region, and lower than or equal to a coverage of the first pillars in the first region. A coverage of the fourth pillars in the second region is higher than a coverage of the fourth pillars in the third region, and lower than or equal to a coverage of the third pillars in the first region.

The embodiments will be explained below by referring to the drawings. The embodiments exemplify a device and method that realize the technical concept of the invention. The drawings are provided merely for schematic or conceptual purposes, and thus may not be identical to the actual dimensions and proportions. Furthermore, the technical concept of the invention is not limited by the form, structure, arrangement or the like of the structural components.

In the following explanation, structural components having basically the same functions and structures will be referred to by the same reference symbols. The reference symbols may contain letters and numerals attached to the letters. When reference symbols containing the same letters are referenced, the corresponding components have the same structure, and are distinguished from each other by the numerals attached to the letters. When components having reference symbols containing the same letters need not be distinguished from each other, these components may be referred to by a reference symbol containing the letters only.

[1] Embodiments

A semiconductor memory device 1 according to the embodiment will be described below.
[1-1] Structure of Semiconductor Memory Device 1
[1-1-1] Overall Structure of Semiconductor Memory Device 1

FIG. 1 shows an exemplary structure of the semiconductor memory device 1 according to the embodiment. The semiconductor memory device 1 is a NAND flash memory configured to store data in a nonvolatile manner, and may be controlled by an external memory controller 2.

As illustrated in FIG. 1, the semiconductor memory device 1 may include a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer larger than or equal to 1). A block BLK is a set of memory cells that can store data in a nonvolatile manner, and may be used as a data erase unit. The memory cell array 10 is provided with a plurality of bit lines and word lines. Each memory cell is associated with one bit line and one word line. The structure of the memory cell array 10 will be discussed later in detail.

The command register 11 holds a command CMD received by the semiconductor memory device 1 from the memory controller 2. The command CMD may include a command for causing the sequencer 13 to implement a read, write, or erase operation or the like.

The address register 12 holds address information ADD received by the semiconductor memory device 1 from the memory controller 2. The address information ADD may include a block address BAd, a page address PAd, and a column address CAd. The block address BAd, page address PAd, and column address CAd may be used for selection of a block BLK, a word line, and a bit line, respectively.

The sequencer 13 controls the overall operation of the semiconductor memory device 1. For example, the sequencer 13 may control the driver module 14, row decoder module 15, and sense amplifier module 16, based on a command CMD held in the command register 11, to implement a read, write, or erase operation.

The driver module 14 generates a voltage to be used for the read, write, and erase operations. The driver module 14 applies the generated voltage to a signal line corresponding to the selected word line, for example, based on the page address PAd held in the address register 12.

The row decoder module 15 selects one of the blocks BLK in the memory cell array 10, based on the block address BAd held in the address register 12. The row decoder module 15 transfers the voltage applied to the signal line corresponding to the selected word line, to the selected word line in the selected block BLK.

The sense amplifier module 16 applies a desired voltage to each bit line in a write operation, in accordance with write data DAT received from the memory controller 2. Furthermore, in a read operation, the sense amplifier module 16 determines the data stored in a memory cell based on the voltage of the bit line, and transfers the determination result as the read data DAT to the memory controller 2.

The above-mentioned semiconductor memory device 1 and memory controller 2 may be combined into a single semiconductor device. Examples of such semiconductor devices include a memory card such as an SD™ card, and a solid state drive (SSD).

[1-1-2] Circuit Structure of Memory Cell Array 10

FIG. 2 illustrates an exemplary circuit structure of the memory cell array 10 in the semiconductor memory device 1 according to the embodiment, focusing on one of the blocks BLK in the memory cell array 10. As illustrated in FIG. 2, a block BLK may contain four string units SU0 to SU3.

Each of the string units SU includes a plurality of NAND strings NS, each associated with one of bit lines BL0 to BLm (where m is an integer greater than or equal to 1). Each NAND string NS includes memory cell transistors MT0 to MT11 and select transistors ST1 and ST2. A memory cell transistor MT includes a control gate and a charge storage layer, and stores the data in a nonvolatile manner. Each of the select transistors ST1 and ST2 is used for selection of a string unit SU in various operations.

In each of the NAND strings NS, the memory cell transistors MT0 to MT11 are coupled in series with each other. The drain of the select transistor ST1 is coupled directly to the associated bit line BL, while the source of the select transistor ST1 is coupled to one end of the serial connection of the memory cell transistors MT0 to MT11. The drain of the select transistor ST2 is coupled to the other end of the serial connection of the memory cell transistors MT0 to MT11. The source of the select transistor ST2 is coupled to a source line SL.

Within a block BLK, the control gates of the memory cell transistors MT0 to MT11 are commonly coupled to the corresponding one of the word lines WL0 to WL11. The gates of the select transistors ST1 in each of the string units SU0 to SU3 are commonly coupled to the corresponding one of the select gate lines SGD0 to SGD3. The gates of the select transistors ST2 within a block BLK are commonly coupled to the select gate line SGS.

Different column addresses are assigned to the bit lines BL0 to BLm. Each bit line BL is shared by the NAND strings NS to which the same column address is assigned among a plurality of blocks BLK. A set of word lines WL0 to WL11 is provided for every block BLK, while a source line SL is shared by different blocks BLK.

A set of memory cell transistors MT commonly coupled to a word line WL in one string unit SU may be referred to as a cell unit CU. The storage capacity of a cell unit CU including the memory cell transistors MT, each of which stores, for example, 1-bit data, is defined as "1-page data". The cell unit CU may have a storage capacity of 2-page data or more in accordance with the number of bits stored in the memory cell transistors MT.

The circuit structure of the memory cell array 10 incorporated in the semiconductor memory device 1 according to the embodiment is not limited to the above. The number of string units SU in a block BLK and the numbers of memory cell transistors MT and select transistors ST1 and ST2 in a NAND string NS may be any number.

[1-1-3] Structure of Memory Cell Array 10

An exemplary structure of the semiconductor memory device 1 according to the embodiment will be described below. In the drawings mentioned below, the X direction corresponds to the direction of extension of the word lines WL, the Y direction corresponds to the direction of extension of the bit lines BL, and the Z direction corresponds to the direction of extension vertical to the surface of a semiconductor substrate 20, which is used for the formation of the semiconductor memory device 1. The plan views are provided with hatch patterns, as appropriate, to enhance the visibility of the drawings. This hatch pattern, however, may not relate to the materials or properties of the hatch-lined structural components. In the cross-sectional views, interlayer insulating films and the like are omitted as appropriate to enhance the visibility of the drawings.

(Planar Layout of Memory Cell Array 10)

Figure 3:
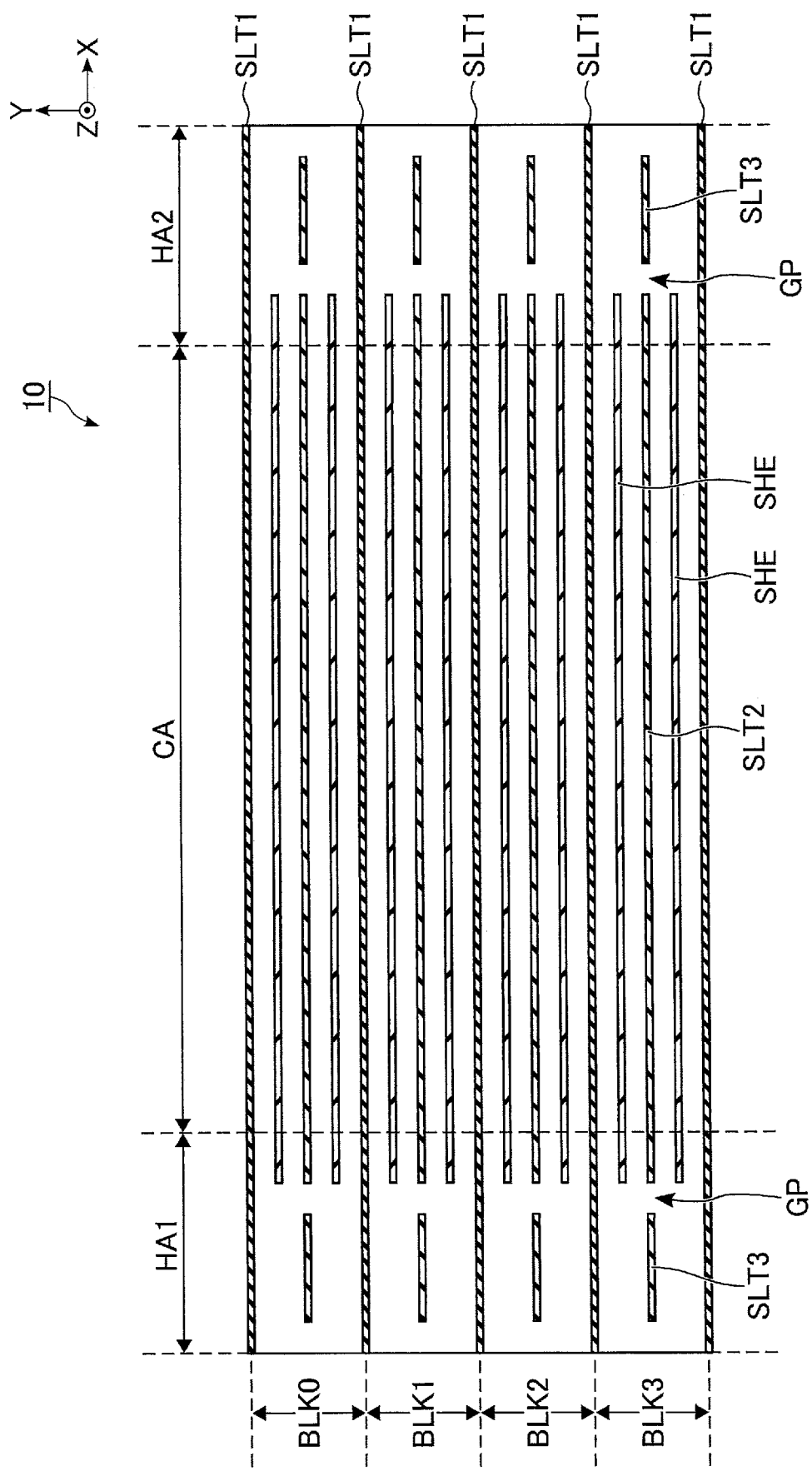
FIG. 3 is a plan view showing an example of a planar layout of the memory cell array in the semiconductor memory device according to the embodiment.

FIG. 3 shows an exemplary planar layout of the memory cell array 10 in the semiconductor memory device 1 according to the embodiment, focusing on a region corresponding to four blocks BLK0 to BLK3. As illustrated in FIG. 3, the planar layout of the memory cell array 10 may be divided in the X direction into a cell area CA and hookup areas HA1 and HA2. The memory cell array 10 includes slits SLT1, SLT2, SLT3, and SHE.

The cell area CA is interposed between the hookup areas HA1 and HA2. A plurality of NAND strings NS are formed in the cell area CA. A plurality of contacts are formed in each of the hookup areas HA1 and HA2 to establish an electrical connection between the row decoder module 15 and any one of the word lines WL, the select gate line SGS and the select gate line SGD coupled to the NAND string NS.

The slits SLT1, SLT2, SLT3, and SHE have a structure in which an insulating material is embedded. These slits separate (insulate) adjacent conductive layers that are provided in the same interconnect layer.

Each of the slits SLT1 extends in the X direction, and is arranged in the Y direction. The slits SLT1 extend in the X direction across the cell area CA and hookup areas HA1 and HA2. The slit SLT1 divides the word lines WL0 to WL11 and the select gate lines SGD and SGS.

Each of the slits SLT2 is arranged between any two adjacent slits SLT1. The slits SLT2 extend in the X direction from an end region of the hookup area HA1 to an end region of the hookup area HA2 across the cell area CA. The slits SLT2 divide the word lines WL0 to WL11, and the select gate lines SGD and SGS.

Each of the slits SLT3 may be arranged between any two adjacent slits SLT1. The slits SLT3 extend in the X direction, and are included in the hookup areas HA1 and HA2. The slits SLT3 divide the word lines WL0 to WL11, and the select gate line SGS.

Each of the slits SHE is arranged between the adjacent slits SLT1 and SLT2. The slits SHE extend in the X direction from the end region of the hookup area HA1 to the end region of the hookup area HA2 across the cell area CA. The slits SHE divide at least the select gate line SGD.

Interposed between any two adjacent slits SLT1, a slit SLT2 is separated from the slit SLT3 in the hookup area HA1 and also from the slit SLT3 in the hookup area HA2. In the following description, a portion interposed between any two adjacent slits SLT1 and having a distance between a slit SLT2 and its adjacent SLT3 will be referred to as a "gap GP".

In the planar layout of the above explained memory cell array 10, each area sectioned by the slits SLT1, SLT2, and SHE in the cell area CA corresponds to one string unit SU. In this example, the string units SU0 to SU3, each extending in the X direction, are aligned in the Y direction. The pattern laid out in FIG. 3 is repeated in the Y direction in the memory cell array 10.

The numbers of slits SLT2 and SLT3 arranged between any two adjacent slits SLT1 may be freely designed. The number of slits SHE arranged between any adjacent slits SLT1 and SLT2 may be freely designed. The number of string units SU arranged between any two adjacent slits SLT1 varies depending on the number of slits SLT2 and SHE arranged between the adjacent two slits SLT1.

(Structure of Memory Cell Array 10 in Cell Area CA)

Figure 4:
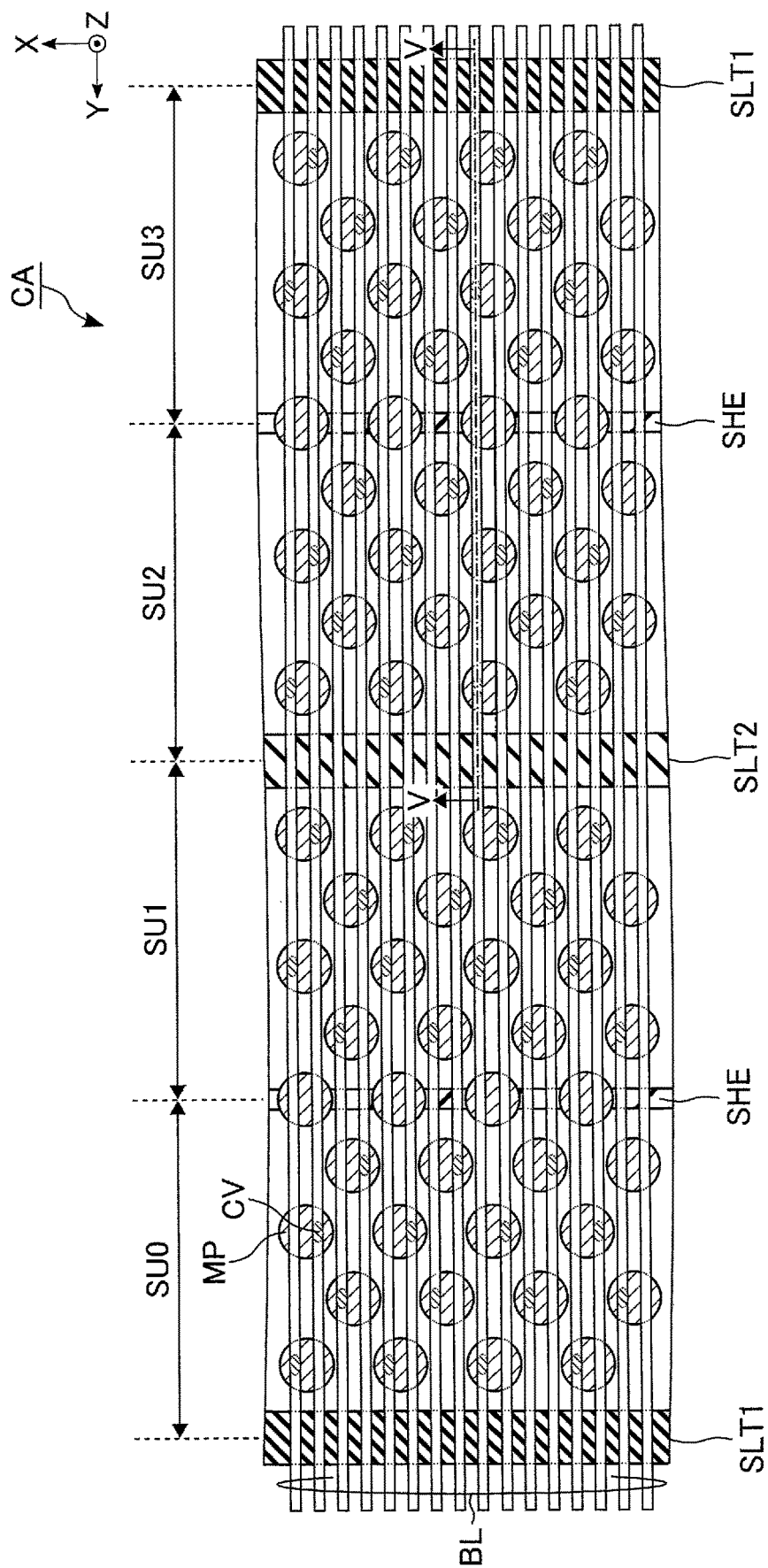
FIG. 4 is a plan view showing an example of a detailed planar layout of a cell area in the memory cell array of the semiconductor memory device according to the embodiment.

FIG. 4 is a plan view showing an example of a detailed planar layout of a cell area CA in the memory cell array 10 of the semiconductor memory device 1 according to the embodiment, where a region corresponding to one block BLK (i.e., string units SU0 to SU3) is focused on. As illustrated in FIG. 4, the memory cell array 10 in the cell area CA includes a plurality of memory pillars MP, a plurality of contacts CV, and a plurality of bit lines BL.

Each of the memory pillars MP functions, for example, as a NAND string NS. The memory pillars MP are arranged in a region between adjacent slits SLT1 and SLT2, in nine staggered rows. Memory pillars MP arranged in the X direction at the middle position between adjacent slits SLT1 and SLT2 may overlap a slit SHE. In other words, the memory pillars MP include those that penetrate the slit SHE and are in contact with the adjacent select gate line SGD.

The bit lines BL extend in the Y direction and are arranged in the X direction. Each of the bit lines BL overlaps at least one memory pillar MP in every string unit SU. In the present example, two bit lines BL overlap each of the memory pillars MP. Between one of the bit lines BL that overlaps a memory pillar MP and this memory pillar MP is formed a contact CV. Each memory pillar MP is electrically coupled to the corresponding bit line BL by way of a contact CV.

A contact CV, however, is omitted between a memory pillar MP that overlaps the slit SHE and a bit line BL. That is, a contact CV between a memory pillar MP in contact with two different select gate lines SGD and a bit line BL is omitted. The numbers and arrangement of memory pillars MP, slits SHE and the like provided between any two adjacent slits SLT are not limited to the structure explained with reference to FIG. 4, and may be modified as needed. The number of bit lines BL that overlap a memory pillar MP may be freely designed.

Figure 5:
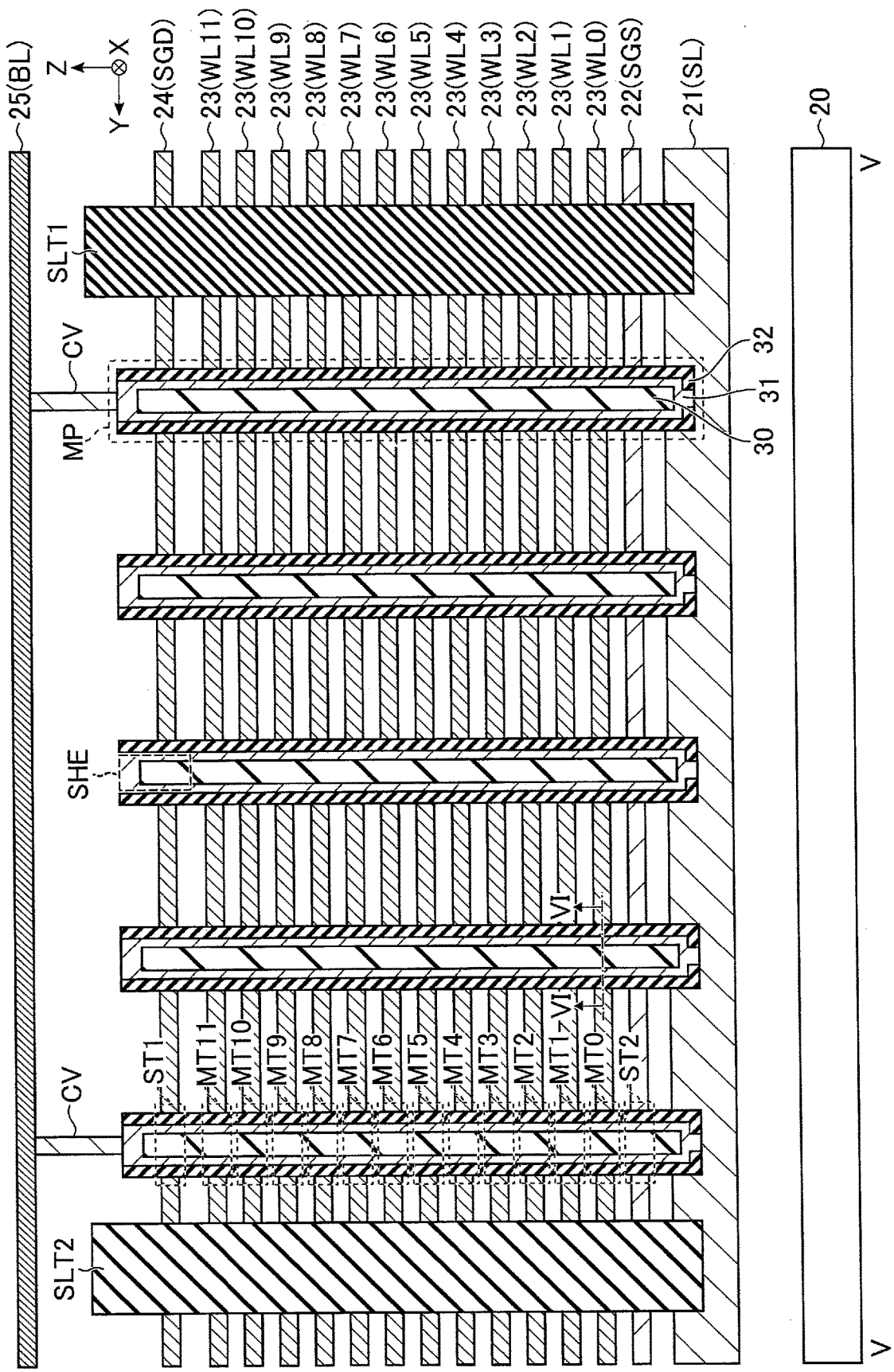
FIG. 5 is a cross-sectional view showing an exemplary cross-sectional structure of a cell area in the memory cell array of the semiconductor memory device according to the embodiment.

FIG. 5 is a cross-sectional view of the structure of FIG. 4 taken along the line V-V, showing an example of a cross-sectional structure of a cell area CA in the memory cell array 10 in the semiconductor memory device 1 according to the embodiment. In FIG. 5, a portion of the memory pillar MP that overlaps the slit SHE in the X direction is indicated by broken lines. As illustrated in FIG. 5, the memory cell array 10 includes conductive layers 21 to 25. The conductive layers 21 to 25 are provided above the semiconductor substrate 20.

In particular, the conductive layer 21 is provided above the semiconductor substrate 20, with an insulating layer interposed between. Circuits corresponding to a row decoder module 15 and a sense amplifier module 16 (not shown) are provided in the insulating layer between the semiconductor substrate 20 and the conductive layer 21. The conductive layer 21 has a structure in which a plurality of plate-like conductive layers expanding in the XY plane are stacked, and is employed as a source line SL. The conductive layer 21 contains phosphorous-doped silicon.

A conductive layer 22 is provided above the conductive layer 21, with an insulating layer interposed between. The conductive layer 22 is formed into a plate expanding in the XY plane, and is employed as a select gate line SGS. The conductive layer 22 contains phosphorous-doped silicon.

The insulating layers and conductive layers 23 are alternately stacked above the conductive layer 22. The conductive layers 23 are formed into, for example, plates expanding along the XY plane. The stacked conductive layers 23 are employed as word lines, and are respectively referred to as word lines WL0 to WL11 in ascending order from the side of the semiconductor substrate 20. The conductive layers 23 may contain tungsten.

A conductive layer 24 is provided above the uppermost conductive layer 23 with an insulating layer interposed between. The conductive layer 24 is formed, for example, into a plate expanding along the XY plane. The conductive layer 24 may be used as a select gate line SGD. The conductive layer 24 may contain tungsten.

A conductive layer 25 is provided above the conductive layer 24 with an insulating layer interposed between. The conductive layer 25 may be formed into a line extending in the Y direction, and is used as a bit line BL. That is, a plurality of conductive layers 25 are provided in the X direction in a region that is not shown in the drawings. The conductive layer 25 may contain copper.

The memory pillars MP extend in the Z direction, penetrating the conductive layers 22 to 24. Each of the memory pillars MP includes a core member 30, a semiconductor layer 31, and stacked films 32.

The core member 30 is provided to extend along the Z direction. For instance, the top end of the core member 30 is included in a layer above the uppermost conductive layer 24, and the bottom end of the core member 30 is included in a layer in which the conductive layer 21 is provided. The semiconductor layer 31 surrounds the periphery of the core member 30. Part of the semiconductor layer 31 is brought into contact with the conductive layer 21 at the bottom of the memory pillars MP. The stacked films 32 cover the side and bottom surfaces of the semiconductor layer 31 except for the portion where the semiconductor layer 31 is in contact with the conductive layer 21. The core member 30 may contain an insulator such as silicon oxide ($SiO_2$). The semiconductor layer 31 may contain silicon.

A pillar-shaped contact CV is provided on the top surface of the semiconductor layer 31 in a memory pillar MP. Of the five memory pillars MP in FIG. 5, contacts CV corresponding to two memory pillars MP are illustrated. The memory pillars MP not overlapping the slit SHE and having no contact CV coupled in the region of this drawing are provided with a contact CV in other regions (not shown).

A single conductive layer 25, or in other words a single bit line BL, is in contact with the top surfaces of the contacts CV. Within each of the regions partitioned by the slits SLT1, SLT2 and SHE as well as the memory pillars MP that are in contact with the slit SHE, a single contact CV is coupled to one conductive layer 25. This means that one memory pillar MP arranged between the slit SLT1 and its adjacent slit SHE and one memory pillar MP arranged between the slit SHE and its adjacent slit SLT2 are electrically connected to each of the conductive layers 25.

A slit SLT is shaped into a plate expanding along the XZ plane so as to partition the conductive layers 22 to 24. The top end of the slit SLT is included in a layer arranged between the conductive layer 24 and conductive layer 25. The bottom end of the slit SLT is arranged, for example, in a level of the layered structure in which the conductive layer 21 is provided. The slit SLT may contain an insulator such as silicon oxide. The slit SLT may include a linear contact. If this is the case, the linear contact may be coupled to the cell source line SL, and be insulated from the conductive layers 22 to 24.

A slit SHE is shaped into a plate expanding along the XZ plane so as to partition the provided conductive layer 24. The top end of the slit SHE is included in a layer arranged between the conductive layer 24 and conductive layer 25. The bottom end of the slit SHE is included, for example, in a layer arranged between the uppermost conductive layer 23 and conductive layer 24. The slit SHE may contain an insulator such as silicon oxide. The top end of the slit SHE may be designed to be aligned with, or unaligned with, the top end of the memory pillar MP.

In the above described structure of the memory pillar MP, the intersecting portion of the memory pillar MP and conductive layer 22 functions as a select transistor ST2. The intersecting portions of the memory pillar MP and the conductive layers 23 function as memory cell transistors MT. The intersecting portion of the memory pillar MP and the conductive layer 24 functions as a select transistor ST1.

Figure 6:
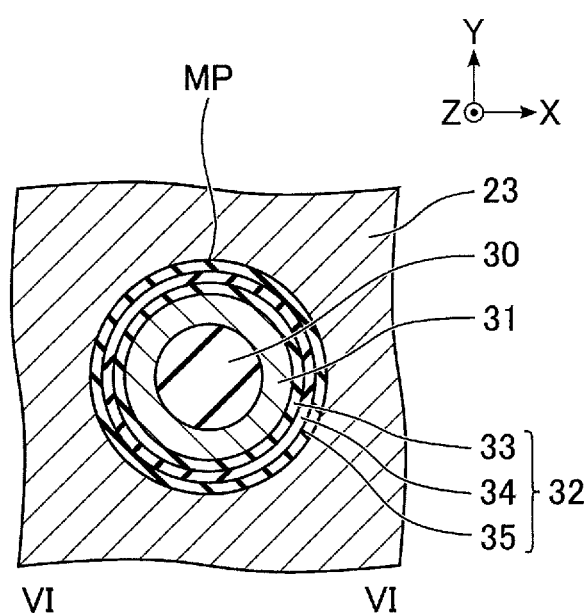
FIG. 6 is a cross-sectional view showing an exemplary cross-sectional structure of a memory pillar in the semiconductor memory device according to the embodiment.

FIG. 6 is a cross-sectional view of the structure of FIG. 5 taken along the line VI-VI, showing an exemplary cross-sectional structure of a memory pillar MP in the semiconductor memory device 1 according to the present embodiment. In particular, FIG. 6 shows a cross-sectional structure of a memory pillar MP taken along a layer parallel to the surface of the semiconductor substrate 20 and including a conductive layer 23. As illustrated in FIG. 6, the stacked films 32 may include a tunnel insulating film 33, an insulating film 34, and a block insulating film 35.

In the layer including the conductive layer 23, the core member 30 is arranged in the center of a memory pillar MP. The semiconductor layer 31 surrounds the peripheral surface of the core member 30. The tunnel insulating film 33 surrounds the peripheral surface of the semiconductor layer 31. The insulating film 34 surrounds the peripheral surface of the tunnel insulating film 33. The block insulating film 35 surrounds the peripheral surface of the insulating film 34. The conductive layer 23 surrounds the peripheral surface of the block insulating film 35.

The semiconductor layer 31 is employed as a channel for the memory cell transistors MT0 to MT11 and select transistors ST1 and ST2. Each of the tunnel insulating film 33 and block insulating film 35 may contain silicon oxide. The insulating film 34 is employed as a charge storage layer for the memory cell transistor MT, and may contain silicon nitride (SiN). In this manner, each of the memory pillars MP functions as a NAND string NS.

(Structure of Memory Cell Array 10 in Hookup Area HA)

In the semiconductor memory device 1 according to the present embodiment, the structure of the hookup area HA1 in an even-numbered block BLK is similar to the structure of the hookup area HA2 in an odd-numbered block BLK, while the structure of the hookup area HA2 in an even-numbered block BLK is similar to the structure of the hookup area HA1 in an odd-numbered block BLK. In particular, the planar layout of the block BLK0 in the hookup area HA2 is the same as that of the block BLK1 in the hookup area HA1 with the X direction and the Y direction reversed. The planar layout of the block BLK1 in the hookup area HA2 is the same as the planar layout of the block BLK0 in the hookup area HA1 when reversed in the X direction and in the Y direction.

Figure 7:
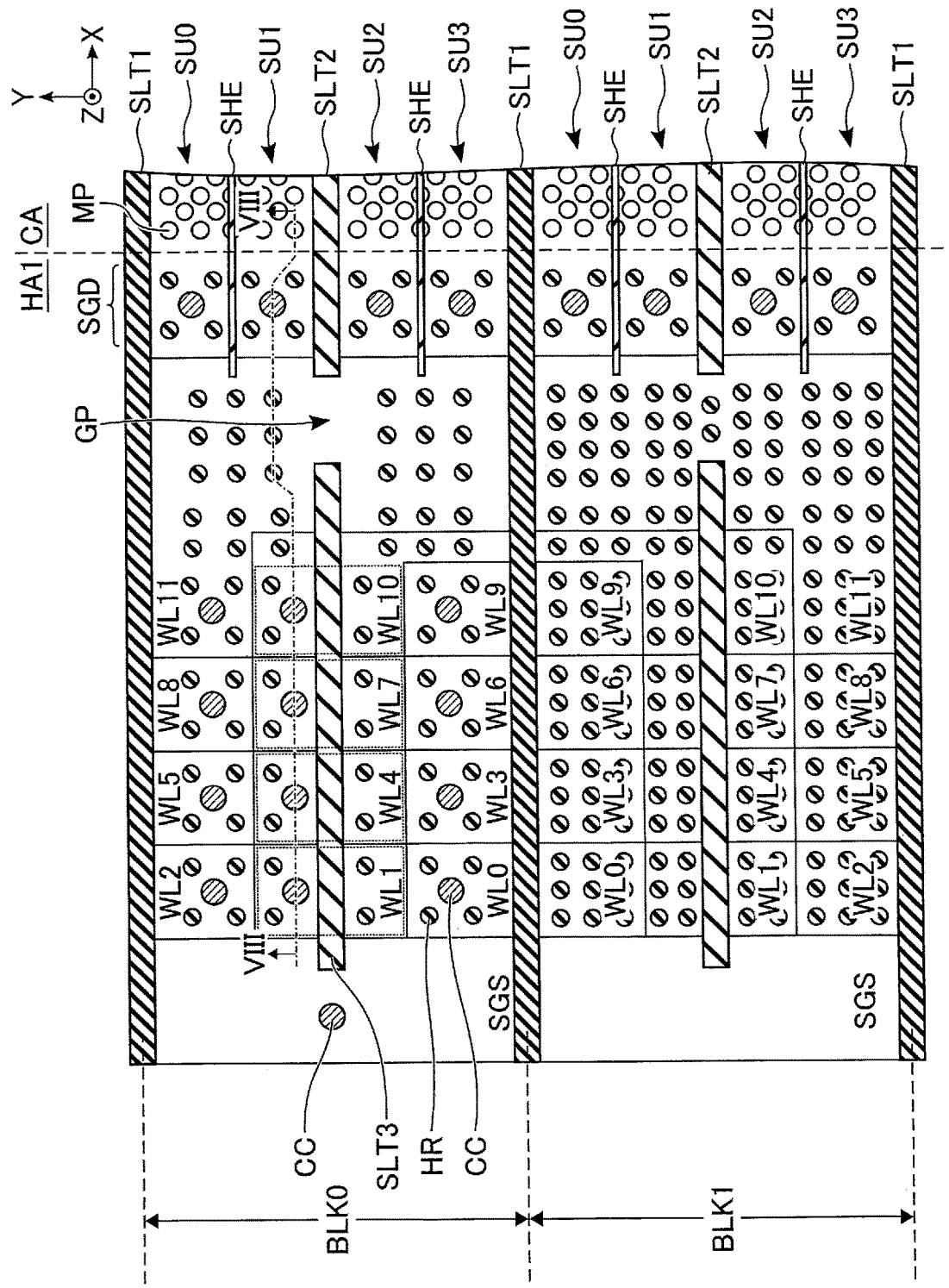
FIG. 7 is a plan view showing an example of a detailed planar layout of a hookup area in the memory cell array of the semiconductor memory device according to the embodiment.

FIG. 7 shows an example of a detailed planar layout of a hookup area HA1 in the memory cell array 10 of the semiconductor memory device 1 according to the embodiment, focusing on the area corresponding to the adjacent blocks BLK0 and BLK1. FIG. 7 also shows part of the cell area CA in the vicinity of the hookup area HA1. The planar layout of the block BLK0 in the hookup areas HA1 and HA2 will be described below, based on the planar layout of the blocks BLK0 and BLK1 in the hookup area HA1 illustrated in FIG. 7.

As illustrated in FIG. 7, each of the select gate line SGS, word lines WL0 to WL11, and select gate line SGD in the hookup area HA1 includes a portion (terraced portion) that does not overlap the upper interconnect layers (conductive layers). The memory cell array 10 in the hookup area HA1 includes a plurality of contacts CC and support pillars HR.

The portion (terraced portion) that is not covered by the upper interconnect layers in the hookup area HA1 resembles a step, terrace, or rimstone. In particular, steps are created between the select gate line SGS and word line WL0, between the word lines WL0 and WL1, . . . between the word lines WL10 and WL11, and between the word line WL11 and select gate line SGD. In this example, the end portions of the word lines WL0 to WL11 have two steps in the Y direction and multiple steps in three rows in the X direction.

Furthermore, in the hookup areas HA1 and HA2, the stepped structure of the word lines WL corresponding to the block BLK1 is the same as the stepped structure of the word lines WL corresponding to the block BLK0 that is reversed with respect to the X direction. In other words, in the hookup areas HA1 and HA2, the direction of the steps created in the word lines WL of the block BLK0 (i.e., any even-numbered block BLK) in the Y direction is opposite to the direction of the steps created in the word lines WL of the block BLK1 (i.e., any odd-numbered block BLK) in the Y direction.

In such a stepped structure of the stacked wiring layers, a slit SLT3 may be arranged midway between two adjacent slits SLT1, across the terraced portions corresponding to the word lines WL1, WL4, WL7 and WL10 in the X direction. The slits SLT3 may or may not be arranged across the terraced portion of the select gate line SGS in the X direction. The slits SHE are arranged midway between two adjacent slits SLT1 and SLT2, across the terraced portion corresponding to the select gate line SGD in the X direction. In this example, the word lines WL of the same layer in the same block BLK are short-circuited by way of a gap GP. In other words, of two adjacent slits SLT1, a word line WL in contact with one slit SLT1 is electrically coupled to a word line WL in contact with the other slit SLT1, by way of the gap GP.

A plurality of contacts CC are provided on the terraced portions of the word lines WL0 to WL11 and select gate lines SGD and SGS in the hookup area HA1 of the block BLK0, and on the terraced portion of the select gate line SGD in the hookup area HA2 of the block BLK0. Each of the word lines WL0 to WL11 and select gate lines SGD and SGS is electrically coupled to the row decoder module 15 by way of the corresponding contact CC. That is, a voltage is applied to the word lines WL from a contact CC provided in either one of the hookup areas HA1 and HA2, while a voltage is applied to the select gate line SGD from the corresponding contacts CC provided in the hookup areas HA1 and HA2.

The support pillars HR are arranged as appropriate in each of the hookup areas HA1 and HA2 of the block BLK0, except for the regions where the slits SLT and the contacts CC are formed. Furthermore, the support pillars HR are arranged so as not to overlap any of the contacts CC and slits SLT. A support pillar HR has a structure in which an insulating material is embedded in a hole extending in the z direction, and penetrates the stacked interconnect layers (such as word lines WL and select gate line SGD).

The arrangement density of support pillars HR arranged in the hookup area HA1 of the block BLK0 is lower than that of support pillars HR arranged in the hookup area HA2 of the block BLK0. In other words, in the block BLK0, the arrangement density of support pillars HR in the hookup area HA2 where no contact CC coupled to the word lines WL is arranged is higher than the arrangement density of support pillars HR in the hookup area HA1 where contacts CC coupled to the word lines WL are arranged. That is, in the block BLK0, the coverage of the support pillars HR in the hookup area HA1 is lower than the coverage of the support pillars HR in the hookup area HA2.

Figure 8:
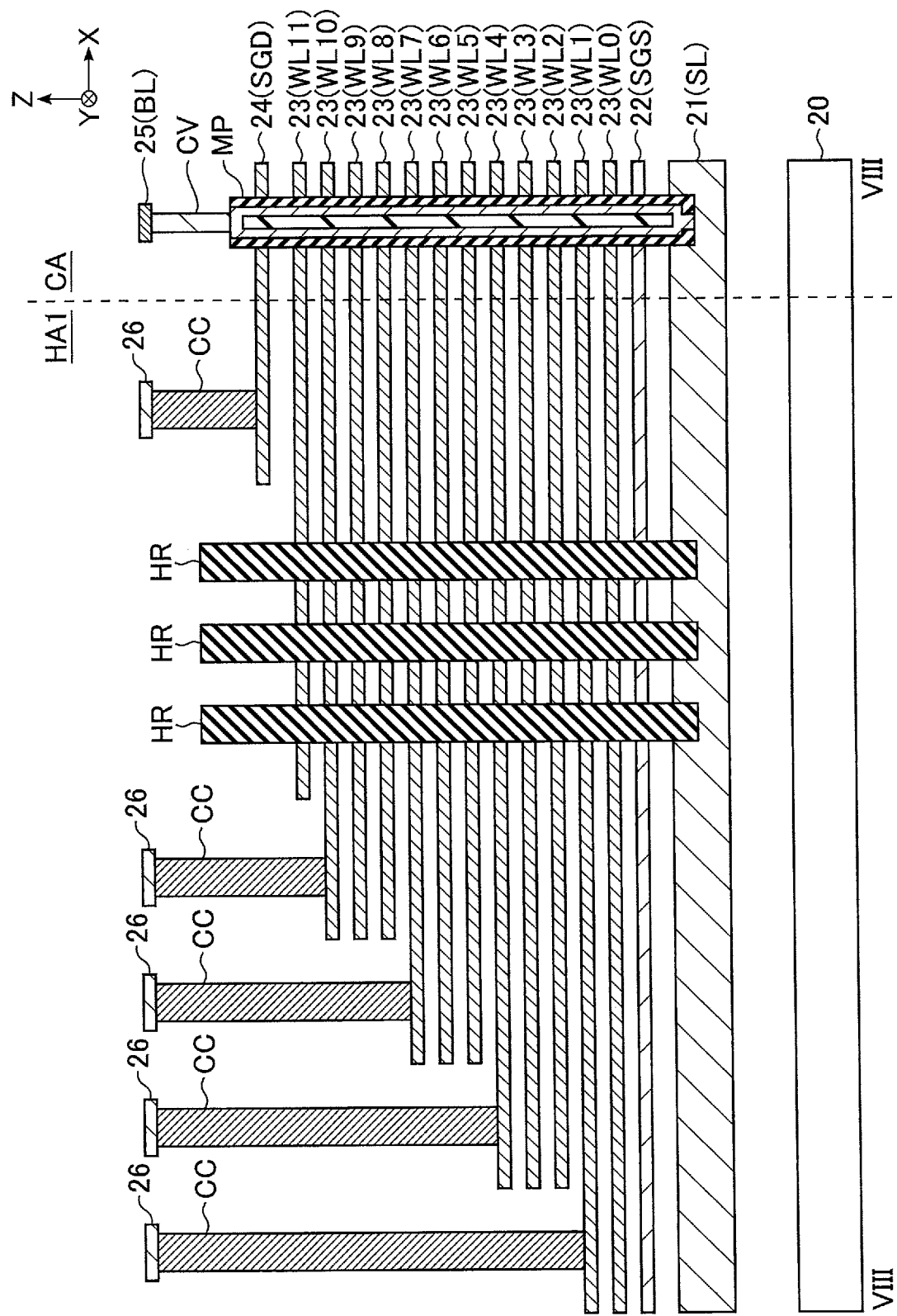
FIG. 8 is a cross-sectional view showing an exemplary cross-sectional structure of a hookup area in the memory cell array of the semiconductor memory device according to the embodiment.

FIG. 8 shows a cross-sectional view of the structure of FIG. 7, taken along the line VIII-VIII, showing an example cross-sectional structure of the hookup area HA1 in the memory cell array 10 of the semiconductor memory device 1 according to the embodiment. FIG. 8 also shows part of the cell area CA in the vicinity of the hookup area HA1. As described in FIG. 8, the end portions of the conductive layers corresponding to the word lines WL and select gate line SGD are formed into stairs in the hookup area HA1. The memory cell array 10 in the hookup area HA1 includes a plurality of conductive layers 26.

A plurality of terraced portions corresponding to the word lines WL1, WL4, WL7, WL10, and select gate line SGD are included in the illustrated region. One contact CC is provided on each of the terraced portions on the four conductive layers 23 corresponding to the word lines WL0, WL4, WL7 and WL10 and the conductive layer 24 corresponding to the select gate line SGD. One conductive layer 26 is arranged on, and electrically coupled to, each of the contacts CC. Each conductive layer 26 is included in the same interconnect layer as the conductive layer 25.

The support pillars HR extend in the Z direction and penetrate the conductive layers 22 and 23. The top ends of the support pillars HR are included in a layer between the conductive layer 25 and the top end of the memory pillar MP. The bottom ends of the support pillars HR are included, for example, in a layer beneath the conductive layer 22. The support pillars HR suffice if their bottom ends reach at least the conductive layer 22. A support pillar HR arranged where the conductive layer 24 is provided is designed to penetrate the conductive layers 22 to 24, and the remaining structure is the same as other support pillars HR in FIG. 8.

(Arrangement of Support Pillars HR and Contacts CC)

Figure 9:
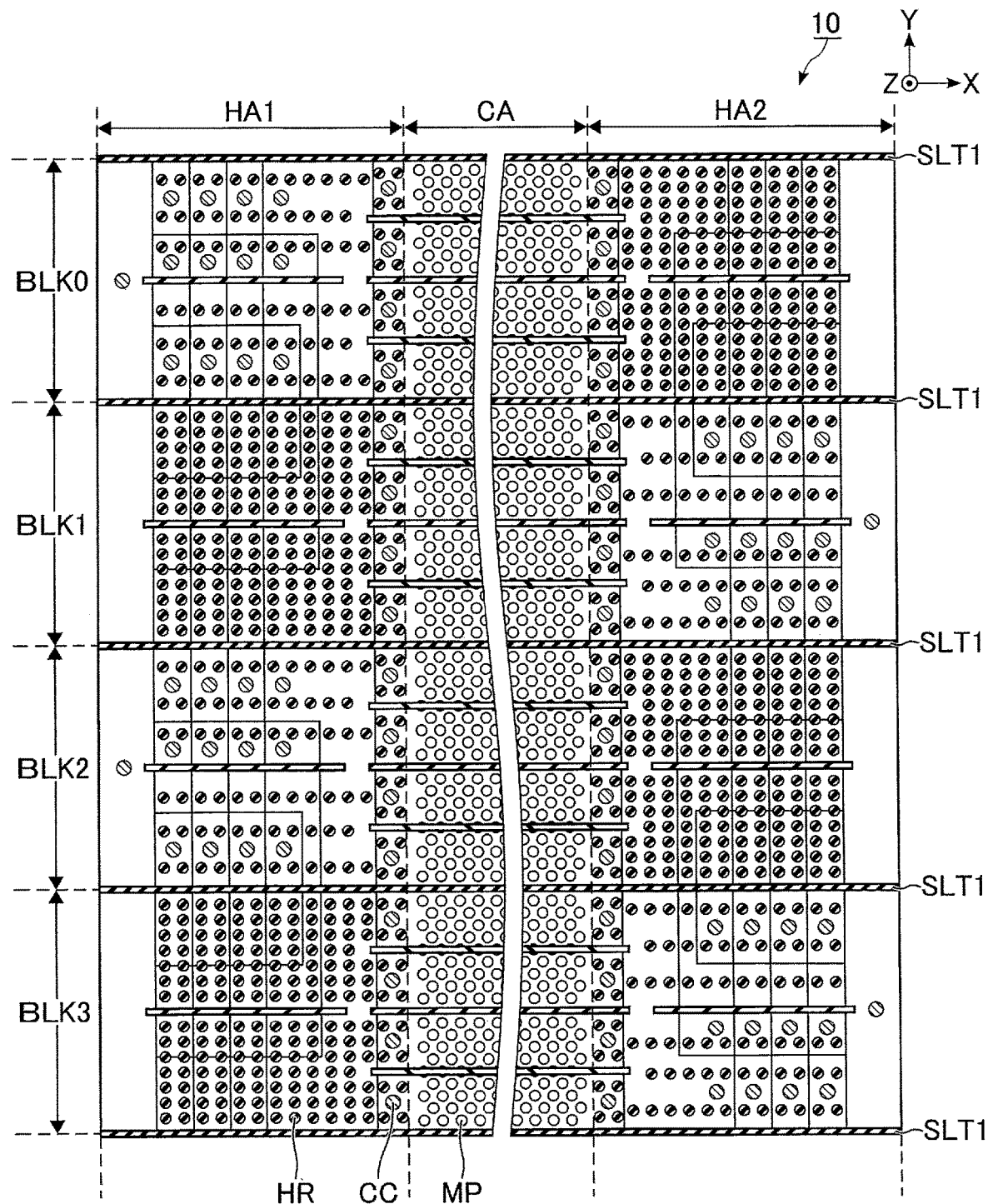
FIG. 9 is a plan view showing an example of a planar layout of a memory cell array in the semiconductor memory device according to the embodiment.

FIG. 9 is a plan view showing an example of a planar layout of a memory cell array 10 in the semiconductor memory device 1 according to the embodiment, providing an overview of the arrangement of support pillars HR and contacts CC in four consecutive blocks BLK0 to BLK3.

As illustrated in FIG. 9, the contacts CC of the word lines WL are arranged in the hookup area HA1 for the even-numbered blocks BLK0 and BLK2, and in the hookup area HA2 for the odd-numbered blocks BLK1 and BLK3. In each block BLK, the contacts CC of the select gate line SGD are arranged in both the hookup areas HA1 and HA2.

Support pillars HR are densely arranged in the hookup area HA2 for the even-numbered blocks BLK0 and BLK2, and in the hookup area HA1 for the odd-numbered blocks BLK1 and BLK3. The coverage of the support pillars HR in the hookup areas HA having the support pillars HR densely arranged is higher than the coverage of the support pillars HR in the hookup area HA having the contacts CC of the word lines WL arranged, and this coverage is preferably as high as the coverage of the memory pillars MP in the cell area CA.

In each block BLK, the contacts CC of the select gate line SGS may be arranged in only one of the hookup areas HA1 and HA2, or in both of the hookup areas HA1 and HA2. If the support pillars HR are arranged around the contacts CC of the select gate line SGS, it is preferable that the contacts CC of the select gate line SGS be arranged in the hookup area HA where the contacts CC of the word lines WL are arranged, in each block ELK.

[1-2] Effects of Present Embodiment

The semiconductor memory device 1 according to the present embodiment explained above can improve yield. The effects produced by the semiconductor memory device 1 according to the present embodiment will be described in detail below.

In a semiconductor memory device with memory cells three-dimensionally stacked, wirings including word lines WL are stacked. To prepare such stacked wirings, a replacement process adopting sacrificial members has been known. The replacement process for stacked wirings will be explained briefly by referring to a comparative example.

Figure 10:
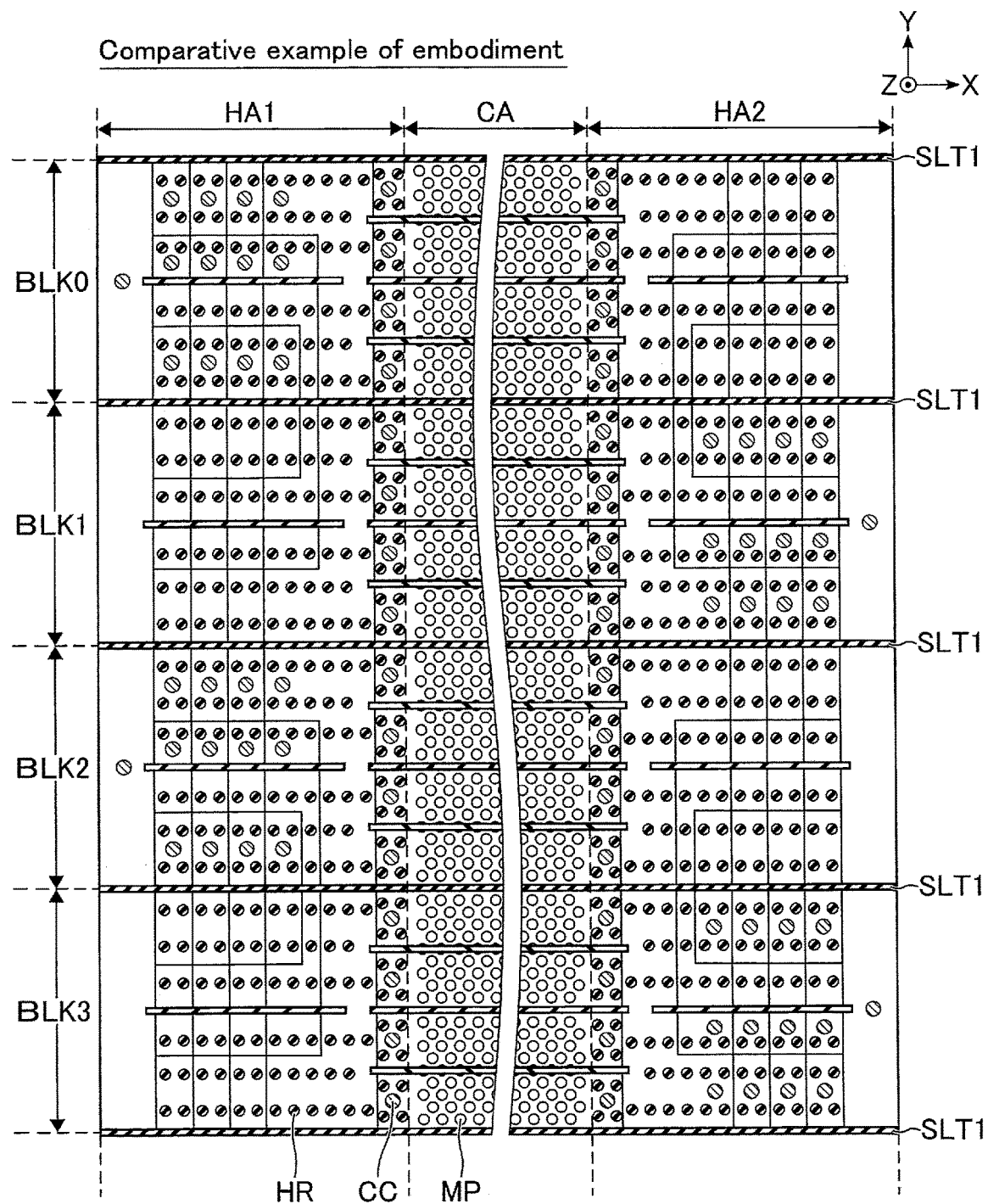
FIG. 10 is a plan view showing an example of a planar layout of a memory cell array in a semiconductor memory device according to a comparative example of the embodiment.

FIG. 10 shows an example of a planar layout of a memory cell array 10 in a semiconductor memory device according to a comparative example of the embodiment, in a manner similar to the region illustrated in FIG. 9. As illustrated in FIG. 10, the arrangement of contacts CC in the comparative example is similar to the embodiment. In the comparative example, however, the arrangement density of the support pillars HR in the hookup area HA where the contacts CC of the word lines WL are not arranged is approximately equal to the arrangement density of the support pillars HR in the hookup area HA where the contacts CC of the word lines WL are arranged, in each block BLK.

FIG. 11 shows an example of a cross-sectional structure in the process of producing a semiconductor memory device according to the comparative example of the present embodiment. Parts of the cell area CA and hookup areas HA where stacked wirings are formed are simplified. Typical processing steps of the replacement process for the stacked wirings are illustrated in (1) to (3) of FIG. 11.

First, as illustrated in (1) of FIG. 11, sacrificial members 41 are stacked. That is, the insulating layers 40 and sacrificial members 41 are alternately stacked, and memory pillars MP are formed to penetrate the stacked insulating layers 40 and sacrificial members 41. Thereafter, the end portions of the sacrificial members 41 are processed to form a stepped structure of the sacrificial members 41 in the hookup area HA. The removed portion of the stepped structure in the hookup area HA is filled with the insulating layer 42, and support pillars HR are formed in the hookup area HA.

Next, as illustrated in (2) of FIG. 11, the sacrificial members 41 are removed. That is, slits SLT are formed to partition the stacked sacrificial members 41. With the etching through the slits SLT, the stacked sacrificial members 41 are selectively removed. At this point, the three-dimensional structure from which the sacrificial members 41 are removed is sustained by the memory pillars MP and support pillars HR.

Finally, as illustrated in (3) of FIG. 11, conductors 43 are formed. That is, the conductors 43 are formed in the space created by the removed sacrificial members 41, for example through chemical vapor deposition (CVD). Thereafter, the conductor remaining in the slits SLT is removed. In this manner, the stacked wirings corresponding to the word lines WL and the like are provided.

In the hookup area HA of the comparative example, the support pillars HR are arranged less densely, which means that a large quantity of conductors 43 are formed in the hookup area HA. The conductors 43 (e.g., tungsten) tend to contract under the thermal process conducted after the deposition of films, with the degree of contraction increasing as the quantity of conductors 43 increases. That is, the degree of contraction of the conductors 43 in the hookup area HA may be greater than that of the conductors 43 in the cell area CA.

As a result of the above, there is a possibility that the layered structure of the conductors 43 in the hookup area HA may be subsided in the semiconductor memory device 1 according to the comparative example. Once such subsidence of the layered structure occurs, unevenness may be created between the cell area CA and hookup area HA, which may cause defocusing in the hookup area HA in the lithography process for forming bit lines BL and the like. The defocusing in the lithography leads to a defect in wirings prepared in this process.

In contrast, in the semiconductor memory device 1 according to the present embodiment, support pillars HR are arranged densely in the hookup area HA where contacts CC are not arranged. The arrangement density of support pillars HR in this area is set approximately to the same level as the arrangement density of memory pillars MP in the cell area CA. That is, the conductors 43 are formed in the area in which the support pillars HR are densely arranged, approximately in the same amount as in the cell area CA.

With the above arrangement, in the semiconductor memory device 1 according to the present embodiment, the degree of subsidence of the layered structure is approximately the same in the cell area CA and in the hookup area HA where the support pillars HR are densely arranged. Furthermore, a staggered pattern is created by the regions in which the support pillars HR are densely arranged, between the hookup areas HA1 and HA2 in the semiconductor memory device 1 according to the present embodiment. Thus, in each of the hookup areas HA1 and HA2, local unevenness that relates to subsidence of the layered structure can be suppressed.

As discussed above, in the semiconductor memory device 1 according to the present embodiment, unevenness in the hookup areas HA1 and HA2 can be suppressed, and therefore defocusing can also be suppressed in the lithography process subsequent to the replacement process of the stacked wirings. Accordingly, the structure of the semiconductor memory device 1 according to the present embodiment can suppress a failure of wiring formation and thereby improve yield.

[2] Modification Example 1 of Embodiment

Figure 12:
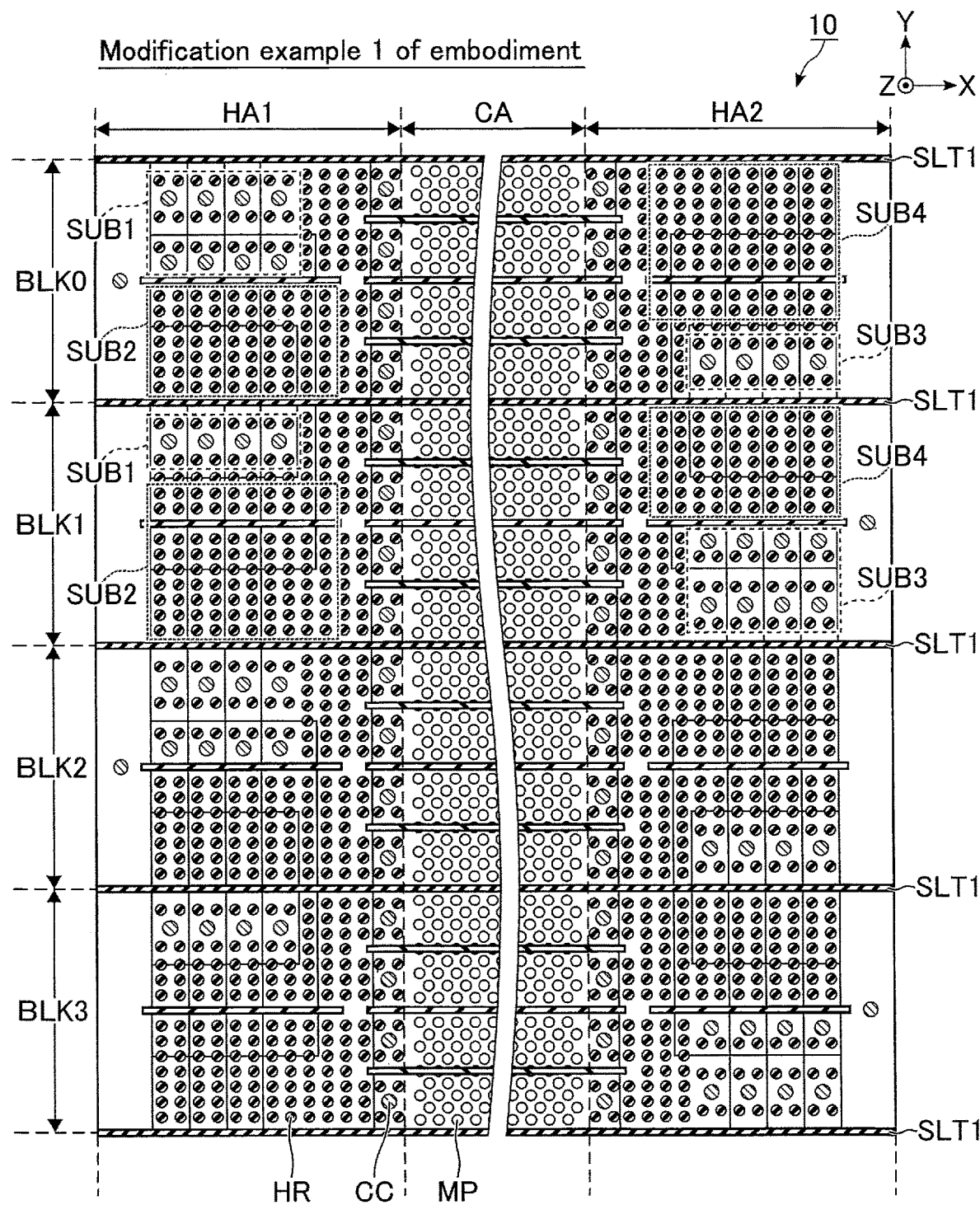
FIG. 12 is a plan view showing an exemplary planar layout of a memory cell array in a semiconductor memory device according to the first modification example of the embodiment.

A semiconductor memory device 1 according to the first modification example of the embodiment will be described below. The semiconductor memory device according to the first modification example of the embodiment differs from the above mentioned embodiment in the arrangement of contacts CC and support pillars HR. FIG. 12 shows an exemplary planar layout of a memory cell array 10 in the semiconductor memory device 1 according to the first modification example of the embodiment. The areas similar to those in FIG. 9 are illustrated.

As illustrated in FIG. 12, in the even-numbered blocks BLK0 and BLK2, the contacts CC of the word lines WL1, WL2, WL4, WL5, WL7, WL8, WL10, and WL11 are arranged in the hookup area HA1, while the contacts CC of the word lines WL0, WL3, WL6, and WL9 are arranged in the hookup area HA2.

Similarly, in the odd-numbered blocks BLK1 and BLK3, the contacts CC of the word lines WL0, WL3, WL6, and WL9 are arranged in the hookup area HA1, while the contacts CC of the word lines WL1, WL2, WL4, WL5, WL7, WL8, WL10, and WL11 are arranged in the hookup area HA2.

In the first modification example, in the hookup area HA1, each block BLK includes a sub-region SUB1 that contains contacts CC, and a sub-region SUB2 that differs from the sub-region SUB1. A plurality of support pillars HR are arranged in each of the sub-regions SUB1 and SUB2. The coverage of the support pillars HR in the sub-region SUB2 is higher than the coverage of the support pillars HR in the sub-region SUB1 and lower than or equal to the coverage of the memory pillars MP in the cell area CA.

Similarly, in the hookup area HA2, each block BLK includes a sub-region SUB3 that contains contacts CC and a sub-region SUB4 that differs from the sub-region SUB3. A plurality of support pillars HR are arranged in each of the sub-regions SUB3 and SUB4. The coverage of the support pillars HR in the sub-region SUB4 is higher than the coverage of the support pillars HR in the sub-region SUB3 and lower than or equal to the coverage of the memory pillars MP in the cell area CA.

The coverage of the support pillars HR in the sub-region SUB1 is approximately equal to the coverage of the support pillars HR in the sub-region SUB3. The coverage of the support pillars HR in the sub-region SUB2 is approximately equal to the coverage of the support pillars HR in the sub-region SUB4.

As described above, the semiconductor memory device 1 according to the first modification example of the embodiment suitably allocates the contacts CC of the word lines WL to the hookup areas HA1 and HA2 for each block BLK. In each of the hookup areas HA1 and HA2, support pillars HR are densely arranged in regions other than the regions having the contacts CC of the word lines WL arranged.

Thus, the semiconductor memory device 1 according to the first modification example of the embodiment can suppress the localized unevenness in the hookup areas HA to a greater degree than in the embodiment. The semiconductor memory device 1 according to the first modification example of the embodiment therefore improves yield further than the embodiment.

[3] Modification Example 2 of Embodiment

Figure 13:
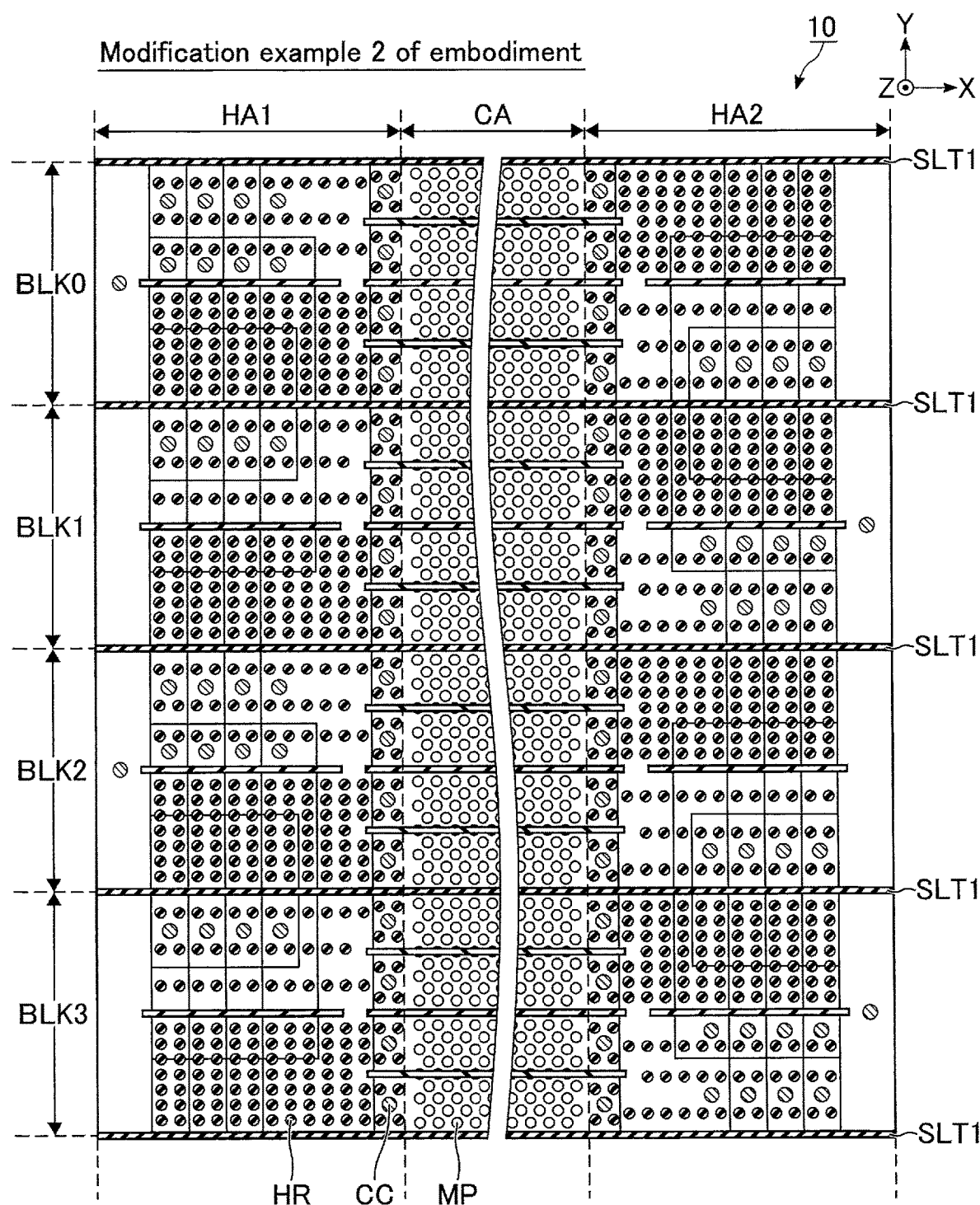
FIG. 13 is a plan view showing an exemplary planar layout of a memory cell array in a semiconductor memory device according to the second modification example of the embodiment.

A semiconductor memory device 1 according to the second modification example of the embodiment will be described below. The semiconductor memory device according to the second modification example of the embodiment differs from the embodiment in the arrangement of contacts CC and support pillars HR. FIG. 13 shows an exemplary planar layout of a memory cell array 10 in the semiconductor memory device 1 according to the second modification example of the embodiment. The areas similar to FIG. 9 are illustrated.

As illustrated in FIG. 13, in the even-numbered blocks BLK0 and BLK2, the contacts CC of the word lines WL1, WL2, WL4, WL5, WL7, WL8, WL10, and WL11 are arranged in the hookup area HA1, and the contacts CC of the word lines WL0, WL3, WL6, and WL9 are arranged in the hookup area HA2.

Similarly, in the odd-numbered blocks BLK1 and BLK3, the contacts CC of the word lines WL0, WL3, WL6, and WL9 are arranged in the hookup area HA1, while the contacts CC of the word lines WL1, WL2, WL4, WL5, WL7, WL8, WL10, and WL11 are arranged in the hookup area HA2.

Furthermore, according to the second modification example of the embodiment, in each block ELK, the contacts CC are arranged in a region on the upper side of the drawing sheet with respect to the slit SLT3, while the support pillars HR are densely arranged in a region on the lower side of the sheet in the hookup area HA1 In each block BLK, the contacts CC are arranged in a region on the lower side of the drawing sheet with respect to the slit SLT3, while the support pillars HR are densely arranged in a region on the upper side of the sheet in the hookup area HA2.

In other words, the contacts CC are arranged on the terraced portion of the hookup area HA1 facing the string units SU0 and SU1 in the X direction, and on the terraced portion of the hookup area HA2 facing the string units SU2 and SU3 in the X direction in each block BLK. The support pillars HR are densely arranged on the terraced portion of the hookup area HA2 facing the string units SU0 and SU1 in the X direction, and on the terraced portion of the hookup area HA1 facing the string units SU2 and SU3 in the X direction.

As mentioned earlier, the semiconductor memory device 1 according to the second modification example of the embodiment suitably allocates the contacts CC of the word lines WL to the hookup areas HA1 and HA2 in each block BLK. The regions of the hookup areas HA1 and HA2 where the contacts CC of the word lines WL are arranged and where the support pillars HR are densely arranged form a staggered pattern.

As a result, the semiconductor memory device 1 according to the second modification example can suppress localized unevenness in the hookup areas HA further than in the above mentioned embodiment. Accordingly, the semiconductor memory device 1 according to the second modification example of the embodiment can improve yield further than in the embodiment.

[4] Modification Example 3 of Embodiment

Figure 14:
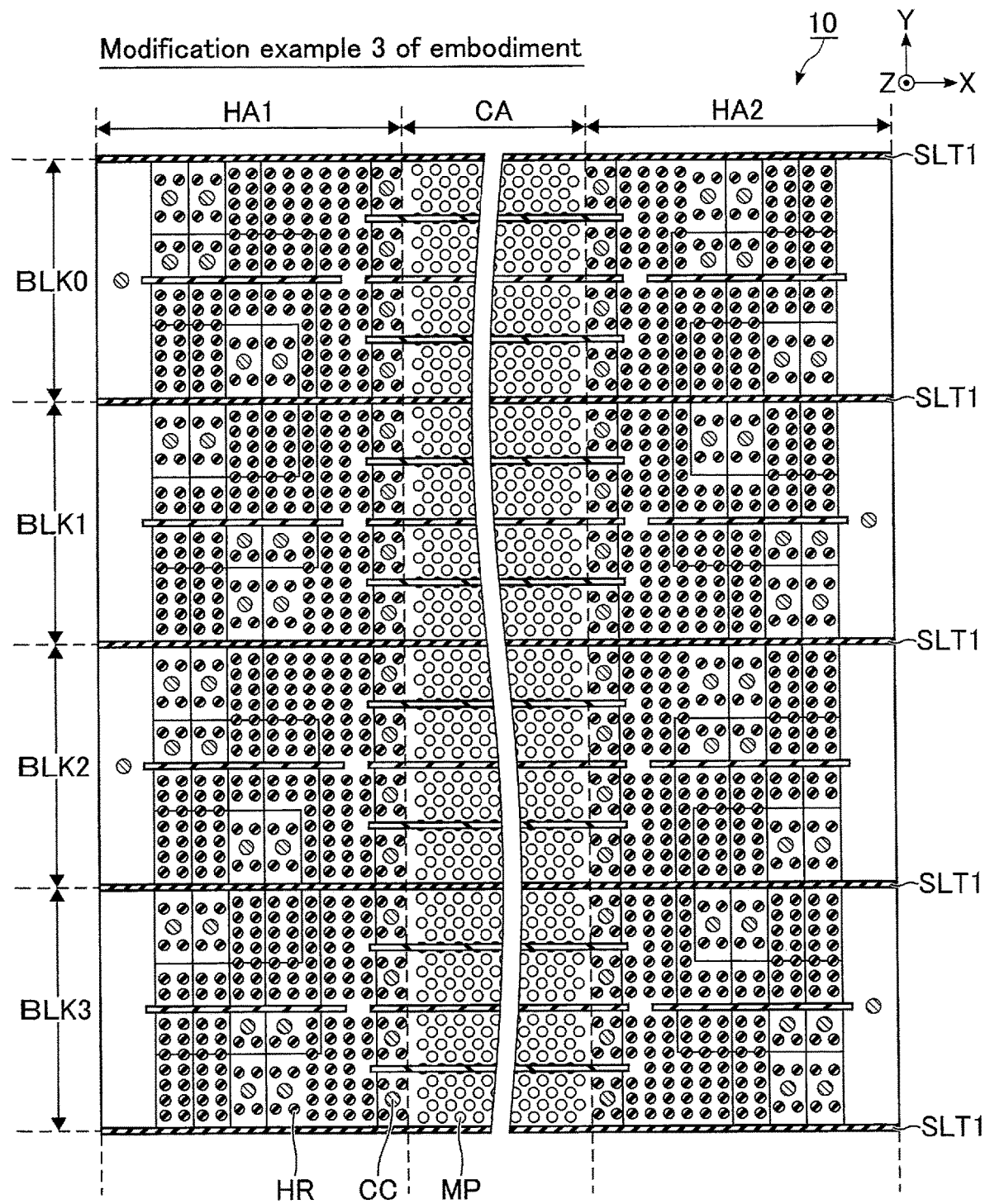
FIG. 14 is a plan view showing an exemplary planar layout of a memory cell array in a semiconductor memory device according to the third modification example of the embodiment.

A semiconductor memory device 1 according to the third modification example of the embodiment will be described below. The semiconductor memory device according to the third modification example of the embodiment differs from the embodiment in the arrangement of contacts CC and support pillars HR. FIG. 14 shows an exemplary planar layout of a memory cell array 10 in a semiconductor memory device 1 according to the third modification example of the embodiment. The areas similar to FIG. 9 are illustrated.

As illustrated in FIG. 14, in the even-numbered blocks BLK0 and BLK2, the contacts CC of the word lines WL1, WL2, WL4, WL5, WL6, and WL9 are arranged in the hookup area HA1, and the support pillars HR are densely arranged on the terraced portions of the word lines WL0, WL3, WL7, WL8, WL10, and WL11 in the hookup area HA1 The contacts CC of the word lines WL0, WL3, WL7, WL8, WL10, and WL11 are arranged in the hookup area HA2, and the support pillars HR are densely arranged on the terraced portions of the word lines WL1, WL2, WL4, WL5, WL6, and WL9 in the hookup area HA2.

Similarly, in the odd-numbered blocks BLK1 and BLK3, the contacts CC of the word lines WL0, WL3, WL7, WL8, WL10, and WL11 are arranged in the hookup area HA1, and the support pillars HR are densely arranged on the terraced portions of the word lines WL1, WL2, WL4, WL5, WL6, and WL9 in the hookup area HA1. The contacts CC of the word lines WL1, WL2, WL4, WL5, WL6, and WL9 are arranged in the hookup area HA2, and the support pillars HR are densely arranged on the terraced portions of the word lines WL0, WL3, WL7, WL8, WL10, and WL11 in the hookup area HA2.

In other words, in each block BLK of the hookup area HA1, contacts CC are arranged in the region on the upper side of the drawing sheet with respect to the slit SLT3 and further away from the cell area CA, and in the region on the lower side of the drawing sheet and closer to the cell area CA, while the support pillars HR are densely arranged in the region on the upper side of the drawing sheet and closer to the cell area CA, and in the region on the lower side of the drawing sheet and further away from the cell area CA. In each block BLK of the hookup area HA2, the contacts CC are arranged in the region on the upper side of the drawing sheet with respect to the slit SLT3 and closer to the cell area CA, and in the region on the lower side of the drawing sheet and further away from the cell area CA, while the support pillars HR are densely arranged in the region on the upper side of the drawing sheet and further away from the cell area CA, and in the region on the lower side of the drawing sheet and closer to the cell area CA.

Furthermore, in each block BLK of the hookup area HA1, the coverage of the support pillars HR in the region on the upper side of the drawing sheet with respect to the slit SLT3 and further away from the cell area CA is approximately equal to the coverage of the support pillars HR in the region on the lower side of the drawing sheet and closer to the cell area CA. The coverage of the support pillars HR in the region on the lower side of the drawing sheet with respect to the slit SLT3 and further away from the cell area CA is approximately equal to the coverage of the support pillars HR in the region on the upper side of the drawing sheet and closer to the cell area CA.

Similarly, in each block BLK of the hookup area HA2, the coverage of the support pillars HR in the region on the upper side of the drawing sheet with respect to the slit SLT3 and closer to the cell area CA is approximately equal to the coverage of the support pillars HR in the region on the lower side of the drawing sheet and further away from the cell area CA. The coverage of the support pillars HR in the region on the lower side of the drawing sheet with respect to the slit SLT3 and closer to the cell area CA is approximately equal to the coverage of the support pillars HR in the region on the upper side of the drawing sheet and further away from the cell area CA.

As described above, in the semiconductor memory device 1 according to the third modification example of the embodiment, the regions including contacts CC form a staggered pattern in each of the hookup areas HA1 and HA2 in each block BLK. In the hookup areas HA1 and HA2, support pillars HR are densely arranged except for the regions including the contacts CC.

As a result, the semiconductor memory device 1 according to the third modification example of the embodiment can suppress localized unevenness in the hookup areas HA further than in the embodiment. Accordingly, the semiconductor memory device 1 according to the third modification example of the embodiment can improve yield further than the embodiment.

[5] Other Modification Examples

A semiconductor memory device according to an embodiment includes a substrate, first to third insulating members, a first conductor, a second conductor, a plurality of first pillars, a plurality of second pillars, a plurality of third pillars, and a plurality of fourth pillars. The substrate includes a first region, a second region and a third region. The first region includes memory cells and is interposed between the second region and the third region along a first direction. The first to third insulating members are arranged in a second direction intersecting the first direction. Each of the first to third insulating members is provided across the first to third regions along the first direction. The first conductor is provided above the substrate and between the first insulating member and the second insulating member. The second conductor is provided above the substrate and between the second insulating member and the third insulating member. The first pillars are provided in the first region to penetrate the first conductor. The second pillars are provided in the second region or the third region to penetrate the first conductor. The second pillars are separated from a first contact corresponding to the first conductor. The third pillars are provided in the first region to penetrate the second conductor. The fourth pillars are provided in the second region or the third region to penetrate the second conductor. The fourth pillars are separated from a second contact corresponding to the second conductor. A coverage of the second pillars in the third region is higher than a coverage of the second pillars in the second region, and lower than or equal to a coverage of the first pillars in the first region. A coverage of the fourth pillars in the second region is higher than a coverage of the fourth pillars in the third region, and lower than or equal to a coverage of the third pillars in the first region. In this manner, yield can be improved for the semiconductor memory device.

In the present embodiment, support pillars HR solely formed of an insulating material have been discussed as an example. The support pillars HR, however, may have a different structure. For instance, the support pillars HR may have a structure similar to the memory pillars MP, or may have part of the structure of the memory pillars MP. If the support pillars HR have a structure similar to the memory pillars MP, the top surfaces of the support pillars HR are on the same plane as the top surfaces of the memory pillars MP.

According to the embodiment, a structure in which the contacts CC of the select gate line SGD are arranged in each of the hookup areas HA1 and HA2 has been discussed as an example. The contacts CC of the select gate line SGD, however, may be arranged in at least one of the hookup areas HA1 and HA2. If this is the case, the support pillars HR may be densely arranged on the terraced portion of the select gate line SGD that includes no contacts CC, in the same manner as the embodiment. The arrangement of the contacts CC only on either one of the terraced portions of the select gate line SOD may be applicable to the embodiment as well as any of the first to third modification examples.

According to the present embodiment, the memory cell array 10 may have a structure other than the above described structures. For example, the memory pillars MP may have a structure of two or more pillars connected together in the Z direction. Furthermore, the memory pillars MP may have a structure in which a pillar corresponding to the select gate line SGD is connected to a pillar corresponding to the word lines WL. Various types of insulating materials may be adopted to fill the slits SLT.

According to the present embodiment, a structure has been discussed in which the end portions of the word lines WL0 to WL11 include two steps in the Y direction and multiple steps in three rows in the X direction in the hookup areas HA. The structure, however, is not limited thereto. The number of steps formed at the end portions of the stacked word lines WL in the Y direction can be designed to be any number. That is, the end portions of the word lines WL in a hookup area HA can be designed as any stepped structure having any number of rows in the semiconductor memory device 1.

According to the present embodiment, the semiconductor memory device 1 having a structure in which circuits such as a sense amplifier module 16 are arranged underneath the memory cell array 10 has been discussed. The structure, however, is not limited thereto. For instance, the semiconductor memory device 1 may have a structure in which stacked wirings such as word lines WL are provided on the semiconductor substrate 20, or a structure in which a chip having a sense amplifier module 16 is adhered to a chip having a memory cell array 10. If such an adhered structure is adopted, the structure corresponding to the semiconductor substrate 20 may be omitted.

In the drawings used for the explanation of the embodiment, the memory pillars MP and support pillars HR are illustrated as having the same diameter in the Z direction. The pillars, however, are not limited thereto. For instance, the memory pillars MP and support pillars HR may be tapered or reverse tapered, or may be bulged in the middle. In a similar manner, the slits SLT and SHE may be tapered or reverse tapered, or may be bulged in the middle. Moreover, in the embodiment, the memory pillars MP, support pillars HR, and contacts CC have a circular cross section. However, the cross section of each component may be ellipsoidal or any shape.

The term "coupled/connected" throughout the specification refers to electrical coupling, and therefore it may include coupling with some other elements interposed between. The expression "electrically coupled" may be coupling of components with an insulator interposed between as long as the operation can be conducted in the same manner as when being electrically coupled. A "pillar" refers to a structure provided in a hole formed in the process of producing a semiconductor memory device 1.

Throughout the specification, "coverage" refers to a ratio of area of targeted components arranged in a specific area in a planar view. The "coverage" may be a ratio of the area of targeted components penetrating the word lines WL (conductive layers 23) in a specific area in the plane parallel to the surface of the semiconductor substrate 20.

An "area" may be a structure included in the semiconductor substrate 20 throughout the specification. For example, when the semiconductor substrate 20 is defined as including a cell area CA and hookup areas HA1 and HA2, the cell area CA and hookup areas HA1 and HA2 are respectively associated with different areas above the semiconductor substrate 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a substrate including a first region, a second region, and a third region, the first region including memory cells and being interposed between the second region and the third region along a first direction;
    first to third insulating members arranged in a second direction intersecting the first direction, each of the first to third insulating members being provided across the first to third regions along the first direction;
    a first conductor provided above the substrate and between the first insulating member and the second insulating member;
    a second conductor provided above the substrate and between the second insulating member and the third insulating member;
    a plurality of first pillars provided in the first region to penetrate the first conductor;
    a plurality of second pillars provided in the second region or the third region to penetrate the first conductor, the second pillars being separated from a first contact corresponding to the first conductor;
    a plurality of third pillars provided in the first region to penetrate the second conductor; and
    a plurality of fourth pillars provided in the second region or the third region to penetrate the second conductor, the fourth pillars being separated from a second contact corresponding to the second conductor, wherein
    a coverage of the second pillars in the third region is:
        (1) higher than a coverage of the second pillars in the second region, and
        (2) lower than or equal to a coverage of the first pillars in the first region,
    a coverage of the fourth pillars in the second region is:
        (1) higher than a coverage of the fourth pillars in the third region, and
        (2) lower than or equal to a coverage of the third pillars in the first region, and coverage is defined as a total area of pillars per unit area in a plan view.

2. The device of claim 1, wherein
    the coverage of the second pillars in the third region is approximately equal to the coverage of the first pillars in the first region, and
    the coverage of the fourth pillars in the second region is approximately equal to the coverage of the third pillars in the first region.

3. The device of claim 1, wherein each of intersecting portions of the first pillars and the first conductor and intersecting portions of the third pillars and the second conductor functions as a memory cell transistor.

4. The device of claim 1, further comprising:
    a third conductor provided above the substrate and between the first insulating member and the second insulating member to overlap the first conductor; and
    a fourth conductor provided above the substrate and between the second insulating member and the third insulating member to overlap the second conductor, wherein
    the first pillars and at least part of the second pillars further penetrate the third conductor, and
    the third pillars and at least part of the fourth pillars further penetrate the fourth conductor.

5. The device of claim 4, wherein
    the second pillars are separated from a third contact corresponding to the third conductor,
    the fourth pillars are separated from a fourth contact corresponding to the fourth conductor,
    each of the second region and the third region has fourth to seventh regions arranged along the second direction,
    an overlapping area of the fourth region and the second region includes the first contact,
    an overlapping area of the fifth region and the third region includes the third contact,
    an overlapping area of the sixth region and the second region includes the second contact, and
    an overlapping area of the seventh region and the third region includes the fourth contact.

6. The device of claim 5, wherein
    a coverage of the second pillars in the overlapping area of the fourth region and the second region is lower than a coverage of the second pillars in an overlapping area of the fourth region and the third region,
    a coverage of the second pillars in an overlapping area of the fifth region and the second region is higher than a coverage of the second pillars in the overlapping area of the fifth region and the third region, a coverage of the fourth pillars in the overlapping area of the sixth region and the second region is lower than a coverage of the fourth pillars in an overlapping area of the sixth region and the third region, and a coverage of the fourth pillars in an overlapping area of the seventh region and the second region is higher than a coverage of the fourth pillars in the overlapping area of the seventh region and the third region.

7. The device of claim 1, wherein a plurality of structures similar to a structure arranged between the first insulating member and the third insulating member are provided along the second direction.

8. The device of claim 1, wherein each of the first conductor and the second conductor includes tungsten.

9. A semiconductor memory device comprising:

a substrate including a first region, a second region, and a third region, the first region including memory cells and being interposed between the second region and the third region along a first direction;

a first conductive layer provided above the substrate across the first to third regions along the first direction;

a plurality of first pillars provided in the first region to penetrate the first conductive layer; and a plurality of second pillars provided in the second region or the third region to penetrate the first conductive layer, the second pillars being separated from a contact corresponding to the first conductive layer, wherein the second region includes a first sub-region and a second sub-region in correspondence with the first conductive layer, the first sub-region including the contact corresponding to the first conductive layer, the second sub-region not overlapping the first sub-region in a planar view, a coverage of the second pillars in the second sub-region is:

(1) higher than a coverage of the second pillars in the first sub-region, and (2) lower than or equal to a coverage of the first pillars in the first region, and coverage is defined as a total area of pillars per unit area in a plan view.

10. The device of claim 9, wherein the first sub-region and the second sub-region are adjacent to each other in a second direction intersecting the first direction.

11. The device of claim 9, further comprising:

a second conductive layer stacked with the first conductive layer at an interval, wherein the first pillars and at least part of the second pillars further penetrate the second conductive layer, the second pillars are separated from a contact corresponding to the second conductive layer, the third region includes a third sub-region and a fourth sub-region in correspondence with the second conductive layer, the third sub-region including the contact corresponding to the second conductive layer, the fourth sub-region being different from the third sub-region, and a coverage of the second pillars in the fourth sub-region is higher than a coverage of the second pillars in the third sub-region and lower than or equal to the coverage of the first pillars in the first region.

12. The device of claim 11, wherein the third sub-region and the fourth sub-region are adjacent to each other in a second direction intersecting the first direction.

13. The device of claim 11, wherein the coverage of the second pillars in the first sub-region is approximately equal to the coverage of the second pillars in the third sub-region.

14. The device of claim 11, wherein the coverage of the second pillars in the second sub-region is approximately equal to the coverage of the second pillars in the fourth sub-region.

15. The device of claim 9, further comprising:

a third conductive layer stacked with the first conductive layer, the third conductive layer being interposed between the substrate and the first conductive layer at intervals, wherein the first pillars and at least part of the second pillars further penetrate the third conductive layer, the second pillars are separated from a contact corresponding to the third conductive layer, the second region includes the third conductive layer, a fifth sub-region, and a sixth sub-region, the fifth sub-region being different from the first and second sub-regions and including the contact corresponding to the third conductive layer, the sixth sub-region being different from the first, second, and fifth sub-regions, a coverage of the second pillars in the sixth sub-region is higher than a coverage of the second pillars in the fifth sub-region, and lower than or equal to the coverage of the first pillars in the first region, the first sub-region is adjacent to the second sub-region in a second direction intersecting the first direction and the first and sixth sub-regions are arranged in the first direction, and the fifth sub-region is adjacent to the sixth sub-region in the second direction and the second and fifth sub-regions are arranged in the first direction.

16. The device of claim 15, wherein the coverage of the second pillars in the first sub-region is approximately equal to the coverage of the second pillars in the fifth sub-region.

17. The device of claim 15, wherein the coverage of the second pillars in the second sub-region is approximately equal to the coverage of the second pillars in the sixth sub-region.

18. The device of claim 9, wherein the coverage of the second pillars in the second sub-region is approximately equal to the coverage of the first pillars in the first region.

19. The device of claim 9, wherein intersecting portions of the first pillars and the first conductive layer function as a memory cell transistor respectively.

20. The device of claim 9, wherein the first conductive layer includes tungsten.

* * * * *